United States Patent
Eberhardt et al.

(10) Patent No.: US 10,233,114 B2
(45) Date of Patent: Mar. 19, 2019

(54) GLASS COMPOSITION, COMPONENT, AND METHOD FOR PRODUCING A COMPONENT

(71) Applicant: OSRAM GmbH, Munich (DE)

(72) Inventors: Angela Eberhardt, Augsburg (DE); Christina Wille, Friedberg (DE); Christian Rüssel, Jena (DE); Matthias Müller, Jena (DE)

(73) Assignee: OSRAM GmbH, München (DE)

( * ) Notice: Subject to any disclaimer, the term of this patent is extended or adjusted under 35 U.S.C. 154(b) by 330 days.

(21) Appl. No.: 15/102,988

(22) PCT Filed: Dec. 15, 2014

(86) PCT No.: PCT/EP2014/077793
§ 371 (c)(1),
(2) Date: Jun. 9, 2016

(87) PCT Pub. No.: WO2015/091374
PCT Pub. Date: Jun. 25, 2015

(65) Prior Publication Data
US 2016/0304391 A1    Oct. 20, 2016

(30) Foreign Application Priority Data

Dec. 19, 2013  (DE) .................. 10 2013 226 636

(51) Int. Cl.
*B32B 15/04*  (2006.01)
*B32B 17/06*  (2006.01)
(Continued)

(52) U.S. Cl.
CPC .............. *C03C 8/04* (2013.01); *C03C 3/122* (2013.01); *C03C 3/125* (2013.01); *C03C 4/12* (2013.01);
(Continued)

(58) Field of Classification Search
USPC .................................. 428/426, 688
See application file for complete search history.

(56) References Cited

U.S. PATENT DOCUMENTS 4,652,536 A  *  3/1987  Nakajima ............... C03C 3/122
                                                       501/41
5,251,062 A  *  10/1993  Snitzer ............... H01S 3/06716
                                                       252/301.4 R
(Continued)

FOREIGN PATENT DOCUMENTS

CN    101812299 A    8/2010
EP    0858976 A2     8/1998
(Continued)

OTHER PUBLICATIONS

Makishima, A. et al., "Glass Materials Design System: VitrES," Fujitsu Limited Japan, vol. 44, No. 6, Nov. 10, 1993, 6 pages (English Abstract).

(Continued)

*Primary Examiner* — Lauren R Colgan
(74) *Attorney, Agent, or Firm* — Slater Matsil, LLP

(57) ABSTRACT

A glass composition, a device and a method for producing the device are disclosed. In an embodiment, the glass composition includes a tellurium oxide in a proportion of at least 65 mol. % and at most 90 mol. %, $R^1O$ in a proportion between 0 mol. % and 20 mol. %, wherein $R^1$ is selected from Mg, Ca, Sr, Ba, Zn, Mn and combinations thereof and at least one $M^1{}_2O$ in a proportion between 5 mol. % and 25 mol. %, wherein $M^1$ is selected from Li, Na, K and combinations thereof. The glass component further includes at least one $R^2{}_2O_3$ in a proportion between 1 mol. % and 3 mol. %, wherein $R^2$ is selected from Al, Ga, In, Bi, Sc, Y, La, rare earths and combinations thereof, and $M^2O_2$ in a proportion (Continued)

| Glaszusammensetzung | Zusammensetzung in mol-% | | | | | | | | | | |
|---|---|---|---|---|---|---|---|---|---|---|---|
| | A1 | A2 | A3 | A4 | A5 | A6 | A7 | V1 | V2 | V3 | V4 |
| TeO$_2$ | 68,5 | 68,25 | 68,5 | 68,5 | 67,5 | 68,25 | 68,5 | 70 | 75 | 60 | 85 |
| ZnO | 18 | 20 | 18 | 18 | 18 | 18 | 18 | | 20 | 40 | 10 |
| Na$_2$O | 12 | 10 | 12 | 12 | 12 | 12 | 12 | 25 | 5 | | |
| Nb$_2$O$_5$ | | | | | | | | | | | 5 |
| Al$_2$O$_3$ | | 1,75 | | | 2,5 | 1,75 | 1,5 | | | | |
| BaO | | | | | | | | 5 | | | |
| La$_2$O$_3$ | 1,5 | | | | | | | | | | |
| Bi$_2$O$_3$ | | | | 1,5 | | | | | | | |
| Y$_2$O$_3$ | | | 1,5 | | | | | | | | |
| Tg [°C] | 288 | 294 | 292 | 283 | 294 | 291 | 292 | 272 | 296 | 216 | 321 |
| α (100-200 °C) [*10$^{-8}$K$^{-1}$] | | | | | 19 | 19,7 | | | 19,3 | | |
| Te [°C] | 314 | | 308 | 308 | 316 | 323 | 318 | | 329 | | 341 |
| n | | 2,0 | | | 2,0 | 2,0 | | | | | | between 0 mol. % and 2 mol. %, wherein $M^2$ is selected from Ti, Zr, Hf and combinations thereof.

16 Claims, 8 Drawing Sheets

(51) Int. Cl.
   *C03C 8/04* (2006.01)
   *C03C 3/12* (2006.01)
   *C03C 4/12* (2006.01)
   *C03C 12/00* (2006.01)
   *C03C 27/00* (2006.01)

(52) U.S. Cl.
   CPC .............. *C03C 12/00* (2013.01); *C03C 27/00* (2013.01); *C03C 2205/00* (2013.01)

(56) References Cited

U.S. PATENT DOCUMENTS

| | | | |
|---|---|---|---|
| 6,413,891 B1* | 7/2002 | Cho | C03C 3/122 359/343 |
| 7,551,348 B2* | 6/2009 | Chung | C03C 3/122 359/334 |
| 9,688,910 B2* | 6/2017 | Eberhardt | C03C 3/122 |
| 2003/0045421 A1* | 3/2003 | Burger | C03C 3/122 501/41 |
| 2004/0235634 A1* | 11/2004 | Kobayashi | C03C 3/122 501/41 |
| 2006/0231737 A1* | 10/2006 | Matsumoto | H01L 33/56 250/208.1 |
| 2007/0105702 A1* | 5/2007 | Matsumoto | C03C 3/15 501/50 |
| 2009/0018006 A1* | 1/2009 | Ueda | C03C 3/14 501/46 |
| 2013/0056725 A1 | 3/2013 | Eberhardt et al. | |

FOREIGN PATENT DOCUMENTS

| | | |
|---|---|---|
| JP | S623042 A | 1/1987 |
| JP | S62288135 A | 12/1987 |
| JP | H11236240 A | 8/1999 |
| JP | 2002506791 A | 3/2002 |
| JP | 2004043294 A | 2/2004 |
| JP | 2005324969 A | 11/2005 |
| JP | 2008105869 A | 5/2008 |
| JP | 2009224790 A | 10/2009 |
| JP | 2010260790 A | 11/2010 |
| WO | 9200924 A1 | 1/1992 |
| WO | 9200925 A1 | 1/1992 |
| WO | 0127047 A2 | 4/2001 |
| WO | 2008050819 A1 | 5/2008 |
| WO | 2010126097 A1 | 11/2010 |
| WO | 2011104364 A1 | 9/2011 |

OTHER PUBLICATIONS

Rivera, V.A.G. et al., "Waveguide Produced by Fiber on Glass Method using Er3-Doped Tellurite Glass," Journal of Non-Crystalline Solids, vol. 353, Jan. 31, 2007, 5 pages.

Shen, S. et al., "Tellurite Glasses for Broadband Amplifiers and Integrated Optics," Journal of the American Ceramic Society, vol. 85, 2002, 5 pages.

Souza Neto, N.M., et al., "Er3+ Environment in TeO2—ZnO—Na2O Glasses," Journal of Non-Crystalline Solids, vol. 304, 2002, 5 pages.

Tamaoka, T. et al., "Concentration Dependence of Emission Properties of Tm3+-Doped Tellurite Glasses in Telecommunication Wavelength Region," Journal of the Ceramic Society of Japan, vol. 110, 2002, 4 pages.

Tamaoka, T. et al., "Emission Properties of Tm3+—Ln3+ (Ho3+, Tb3+, Eu3+) Co-Doped Tellurite Glasses by Energy Transfer," Journal of the Ceramic Society of Japan, vol. 110, 2002, 4 pages.

Vogel, W., "Glaschemie", Springer-Verlag, Oct. 7, 1992, 9 pages.

* cited by examiner

Fig. 1

| Glaszusammensetzung | Zusammensetzung in mol-% | | | | | | | | | | |
|---|---|---|---|---|---|---|---|---|---|---|---|
| | A1 | A2 | A3 | A4 | A5 | A6 | A7 | V1 | V2 | V3 | V4 |
| TeO$_2$ | 68,5 | 68,25 | 68,5 | 68,5 | 67,5 | 68,25 | 68,5 | 70 | 75 | 60 | 85 |
| ZnO | 18 | 20 | 18 | 18 | 18 | 18 | 18 | | 20 | 40 | 10 |
| Na$_2$O | 12 | 10 | 12 | 12 | 12 | 12 | 12 | 25 | | | |
| Nb$_2$O$_5$ | | | | | | | | | 5 | | 5 |
| Al$_2$O$_3$ | | 1,75 | | | 2,5 | 1,75 | 1,5 | | | | |
| BaO | | | | | | | | 5 | | | |
| La$_2$O$_3$ | 1,5 | | | | | | | | | | |
| Bi$_2$O$_3$ | | | 1,5 | | | | | | | | |
| Y$_2$O$_3$ | | | | 1,5 | | | | | | | |
| Tg [°C] | 288 | 294 | 292 | 283 | 294 | 291 | 292 | 272 | 296 | 216 | 321 |
| α (100-200 °C) [*10$^{-6}$K$^{-1}$] | | | | | 19 | 19,7 | | | 19,3 | | |
| Te [°C] | 314 | | 308 | 308 | 316 | 323 | 318 | | 329 | | 341 |
| n | | 2,0 | | | 2,0 | 2,0 | | | | | |

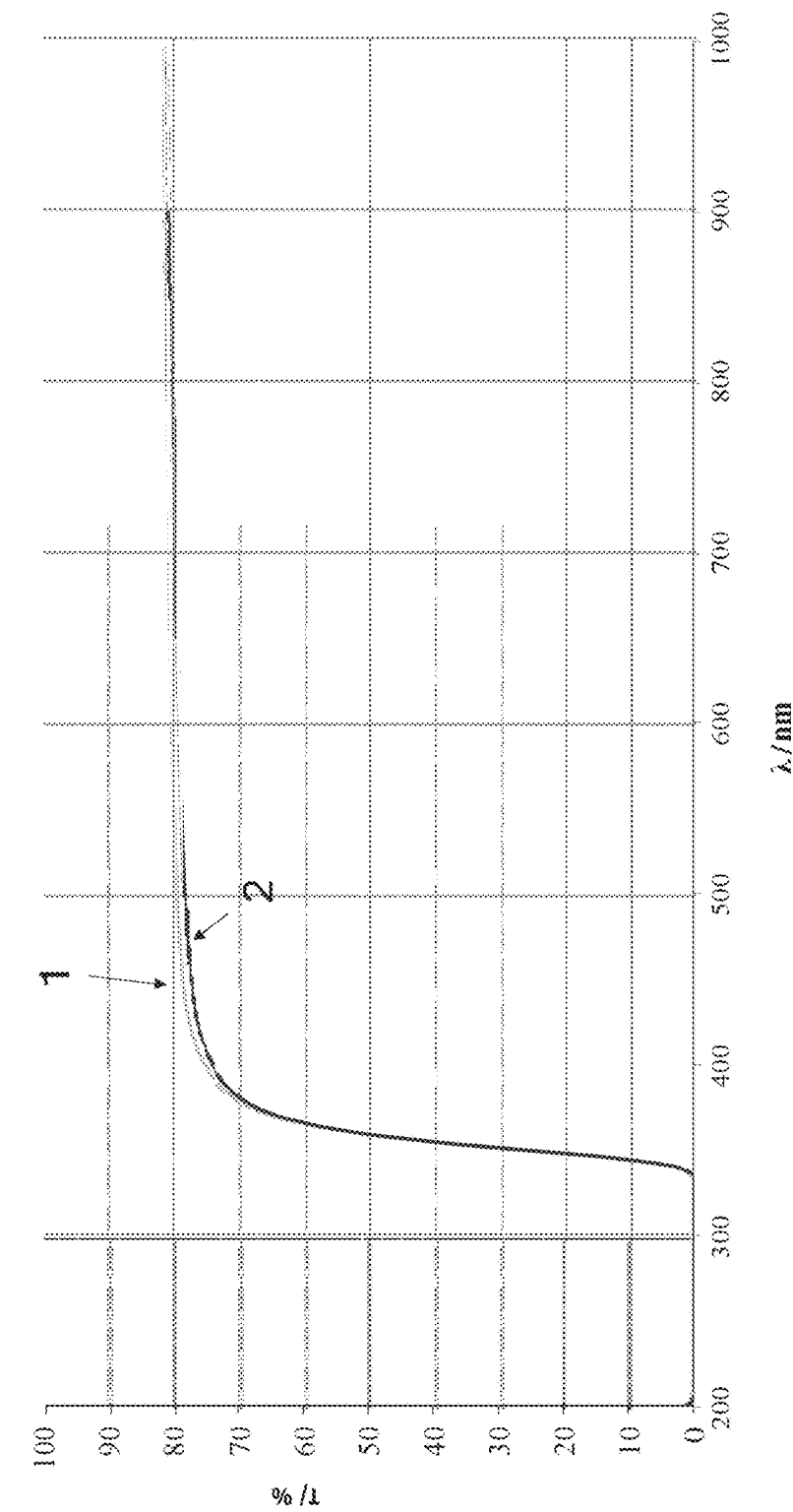

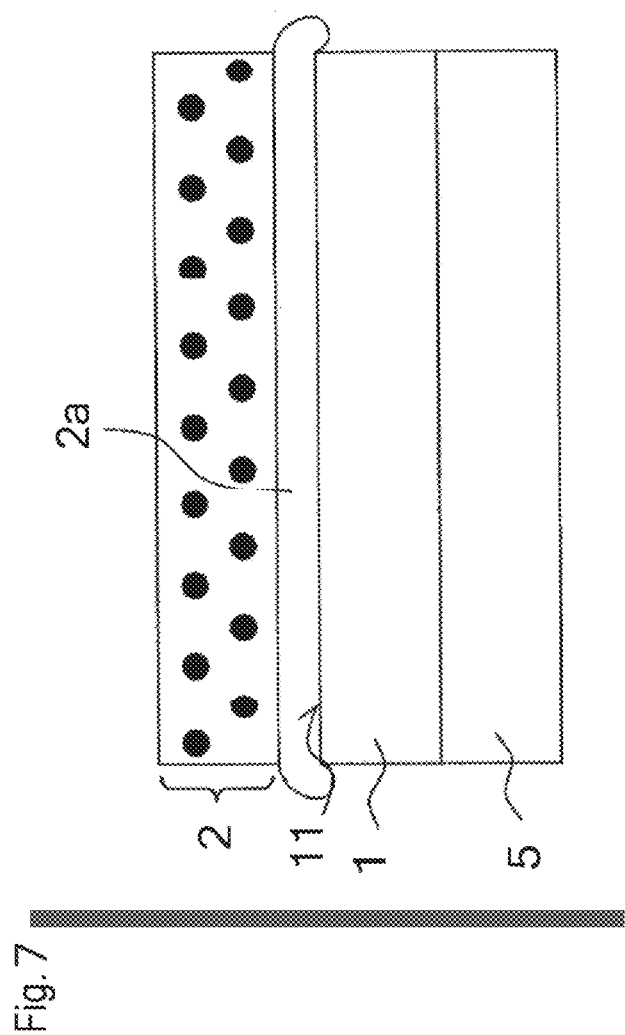

GLASS COMPOSITION, COMPONENT, AND METHOD FOR PRODUCING A COMPONENT

This patent application is a national phase filing under section 371 of PCT/EP2014/077793, filed Dec. 19, 2013, which claims the priority of German patent application 10 2013 226 636.7, filed Dec. 19, 2013, each of which is incorporated herein by reference in its entirety.

TECHNICAL FIELD

A glass composition is provided. Furthermore, a device and a method for producing such a device are provided.

BACKGROUND

Glass solders are conventionally used for joining materials. The glass solders are predominantly introduced between the materials to be joined in powdered form, possibly with the aid of suitable adjuvants such as oils or polymer solutions. This arrangement of the materials to be joined and the powdered glass is then heated to a temperature which permits sintering of the glass particles. At this juncture, compaction of the powder by viscous flow takes place. A temperature is required which is higher than the dilatometric softening temperature. A problem with this is that no glass solders are available for joining temperatures below 400° C. which are at the same time corrosion-stable and have correspondingly high crystallization stability in order to permit the joining process to take place.

Possible compositions for such ultra-low sintering glass solders are primarily phosphate glasses and borate glasses. In both glass systems, glasses are produced with correspondingly low softening points. However, these glasses then contain considerable concentrations of $B_2O_3$ or $P_2O_5$ and alkali oxides and have only a low level of chemical stability. Therefore, they are unsuitable for many applications owing to the lack of corrosion stability. In this case, stability is considered, according to the application, to be, for example, the hydraulic stability or moisture stability in particular at 85° C. and 85% relative humidity for a period of 1000 h.

In addition, corresponding glasses usually have a high tendency to crystallization and so crystallization often takes place more quickly than compaction by viscous flow. Crystallization of the glass solder must never occur prior to complete sintering because otherwise the sintering process will come to a halt. However, for many applications, in particular in optical technologies, it is also disadvantageous when crystallization occurs after complete compaction since in that case, light scattering can be observed on the crystals. For many applications there is a maximum permissible temperature, which is determined, for example, in the case of semiconductors to be joined, by diffusion of doping substances.

A further problem is the adhesion of the glass solders to the materials to be joined; in that case, good wetting of these materials is always a favorable precondition.

In principle, tellurite glasses have favorable preconditions for many applications as joining glass. At this juncture, particular mention should be made of the possibility of setting glass transition temperatures of 300° C. and also somewhat lower.

Tellurite glasses also have sufficient corrosion stability for most applications. However, the crystallization tendency of tellurite glasses is insufficient for many applications or joining processes. For example, although the glass transition temperatures and the softening temperatures fall when tellurite glasses contain alkali oxide and/or zinc oxide, the crystallization tendency also increases thereby.

SUMMARY OF THE INVENTION

Embodiments of the invention provide a glass composition which has improved chemical and physical properties. In particular, various embodiments provide that the glass composition has improved crystallization stability, improved corrosion stability, a glass transition temperature and/or a softening temperature of less than 400° C. Various further embodiments provide a glass composition as an ultra-low melting glass with a glass transition temperature and a softening temperature of less than 400° C. Various other embodiments provide that the glass or glass composition is highly transparent and high-refracting in the visible spectral range. In yet various other embodiments the glass composition has extremely good chemical stability and high crystallization stability.

In embodiments provide a device which is particularly stable and can be produced in particular at temperatures of less than 400° C.

According to at least one embodiment, the glass composition comprises at least one tellurium oxide in a proportion of at least 65 mol. % and at the most 90 mol. % inclusive, $R^1O$ in a proportion between 0 mol. % and 20 mol. % inclusive, wherein $R^1$ is selected from a group which includes magnesium, calcium, strontium, barium, zinc, manganese and combinations thereof, at least one $M^1{}_2O$ in a proportion between 5 mol. % and 25 mol. % inclusive, wherein $M^1$ is selected from a group including lithium, sodium, potassium and combinations thereof, at least one $R^2{}_2O_3$ in a proportion between 1 mol. % and 3 mol. % inclusive, wherein $R^2$ is selected from a group including aluminum, gallium, indium, bismuth, scandium, yttrium, lanthanum, rare earths and combinations thereof, $M^2O_2$ in a proportion between 0 mol. % and 2 mol. % inclusive, wherein $M^2$ is selected from a group including titanium, zirconium, hafnium and combinations thereof, and $R^3{}_2O_5$ in a proportion between 0 mol. % and 6 mol. % inclusive, wherein $R^3$ is niobium and/or tantalum.

The glass composition according to the invention contains components which lower the glass transition temperature and softening temperature and also components which unexpectedly reduce the crystallization tendency without at the same time substantially increasing the glass transition and softening temperatures. In addition, the glass composition according to the invention is corrosion-stable.

According to at least one embodiment, the sum of all proportions of tellurium oxide, $M^1{}_2O$, $R^2{}_2O_3$ and possibly $M^2O_2$, $R^1O$ and $R^3{}_2O_5$ in the glass composition is 100% or 100 mol. % when no further elements or components are contained, or less than 100% or 100 mol. % when, in addition to the above-mentioned components such as tellurium oxide, $M^1{}_2O$, $R^2{}_2O_3$ and possibly $M^2O_2$, $R^1O$ and $R^3{}_2O_5$, further components are contained.

According to at least one embodiment, the glass composition consists of tellurium oxide in a proportion of at least 65 mol. % and at the most 90 mol. % inclusive, $R^1O$ in a proportion between 0.1 mol. % and 15 mol. % inclusive and $R^2{}_2O_3$ in a proportion between 1 mol. % and 3 mol. % inclusive. "Consists of" in this case mean that no further components are contained in the composition. Alternatively, "consists of" can mean that the glass composition contains further components in only a small proportion in the ppm range (parts per million) and these constitute essentially unavoidable impurities in the glass starting materials.

According to at least one embodiment, the glass composition consists of $TeO_2$, ZnO, $Na_2O$ and $R^2_2O_3$ with $R^2$ selected from the group of aluminum, lanthanum, bismuth and yttrium and rare earths. The sum of all proportions in the glass composition is 100% or 100 mol. %. According to at least one embodiment, the glass composition can be obtained from: at least one tellurium oxide in a proportion of at least 65 mol. % and at the most 90 mol. %, $R^1O$ in a proportion between 0 mol. % and 20 mol. %, wherein $R^1$ is selected from a group which includes Mg, Ca, Sr, Ba, Zn, Mn and combinations thereof, at least one $M^1_2O$ in a proportion between 5 mol. % and 25 mol. %, wherein $M^1$ is selected from a group including Li, Na, K and combinations thereof, at least one $R^2_2O_3$ in a proportion between 1 mol. % and 3 mol. %, wherein $R^2$ is selected from a group including Al, Ga, In, Bi, Sc, Y, La, rare earths and combinations thereof, $M^2O_2$ in a proportion between 0 mol. % and 2 mol. %, wherein $M^2$ is selected from a group including Ti, Zr, Hf and combinations thereof, and $R^3_2O_5$ in a proportion between 0 mol. % and 6 mol. %, wherein $R^3$ is Nb and/or Ta.

This means that by softening the above-mentioned components with the corresponding proportions and possibly further process steps, a glass composition can be produced. In particular, the proportion of the initial weight of the components corresponds to the proportion of the components in the glass composition with a maximum deviation of 5%. According to at least one embodiment, the glass composition consists of: at least one tellurium oxide in a proportion of at least 65 mol. % and at the most 90 mol. %, $R^1O$ in a proportion between 0 mol. % and 20 mol. %, wherein $R^1$ is selected from a group which includes Mg, Ca, Sr, Ba, Zn, Mn and combinations thereof, at least one $M^1_2O$ in a proportion between 5 mol. % and 25 mol. %, wherein $M^1$ is selected from a group including Li, Na, K and combinations thereof, at least one $R^2_2IO_3$ in a proportion between 1 mol. % and 3 mol. %, wherein $R^2$ is selected from a group including Al, Ga, In, Bi, Sc, Y, La, rare earths and combinations thereof, $M^2O_2$ in a proportion between 0 mol. % and 2 mol. %, wherein $M^2$ is selected from a group including Ti, Zr, Hf and combinations thereof, and $R^3_2O_5$ in a proportion between 0 mol. % and 6 mol. %, wherein $R^3$ is Nb and/or Ta.

The above-mentioned proportions provide the oxidic composition of the glass or of the glass composition. However, the constituent raw materials do not necessarily have to be added as oxides, but can also be present in the mix as hydroxides, carbonates, nitrates etc, in so far as they exist.

In different embodiments, tellurium oxide can comprise the following chemical compositions tellurium(IV)-oxide ($TeO_2$), tellurium(IV, VI)-oxide ($Te_2O_5$) and/or tellurium (VI)-oxide ($TeO_3$). In particular, the tellurium oxide has a valency of 4 or 6.

According to at least one embodiment, the proportion of tellurium oxide is at least 67 mol. %, 68 mol. %, 70 mol. %, 72 mol. % or 75 mol. %, 77 mol. % and/or at the most 80 mol. %, 82 mol. %, 85 mol. % or 87 mol. %.

According to at least one embodiment, $TeO_2$ is used as the tellurium oxide. $TeO_2$ has a proportion of at least 67 mol. % and at the most 69 mol. % inclusive. In particular, the proportion of tellurium oxide is 68.5 mol. %. The inventors have recognized that a glass composition comprising such a proportion of tellurium oxide has particularly advantageous properties such as crystallization stability, sinterability at temperatures of less than 400° C. and low softening and glass transition temperatures. The glass composition is thus particularly well suited to the joining or bonding of materials and/or for the use of such materials in devices. However, the proportion of at least 67 mol. % and at the most 69 mol. % inclusive does not necessary have to be selected for tellurium oxide. A proportion of tellurium oxide in the range of 65 mol. % to 90 mol. % can also be used.

The glass composition can alternatively or additionally comprise at least one alkaline earth oxide and/or zinc oxide and/or manganese oxide as $R^1O$. In particular, the proportion of $R^1O$ is at least 10 mol. %, 12 mol. % or 14 mol. % and/or at the most 16 mol. %, 18 mol. % or 18.5 mol. %.

Combinations of magnesium, calcium, strontium, barium, manganese and zinc with respect to $R^1O$ means here and hereinafter that at least two components, for example, magnesium and calcium or zinc and barium, or even three components can be present together in the glass composition as an oxide.

According to at least one embodiment, $R^1O$ is zinc oxide and/or barium oxide.

The glass composition comprises alkali oxide ($M^1_2O$). In particular, the proportion is at least 4 mol. %, 6 mol. %, 8 mol. %, 10 mol. % or 12 mol. % and/or at the most 14 mol. %, 16 mol. %, 18 mol. %, 20 mol. %, 22 mol. % or 24 mol. %. For example, the proportion of $M^1_2O$ is 10 mol. % to 12 mol. % (limits included).

Lithium oxide ($Li_2O$), sodium oxide ($Na_2O$) or potassium oxide ($K_2O$) and combinations of the three named oxides can be used to produce the glass composition or can be used in the glass composition.

The principle task of the alkali oxides is to lower the viscosity of the glass or of the glass composition, which in turn is advantageous in joining temperature-sensitive materials at low temperatures or embedding temperature-sensitive materials in the glass. Joining means in this case the connection of materials so that these materials form a firm bond. In particular, lithium oxide and/or sodium oxide ($Li_2O$ and $Na_2O$) are used since these lower the softening temperature to the greatest extent but reduce the chemical stability to the smallest extent as, for example, potassium oxide ($K_2O$).

The glass composition further comprises oxides of trivalent metals, such as aluminum, gallium, indium, bismuth, scandium, yttrium, lanthanum, rare earths and combinations thereof ($R^2_2O_3$). In particular oxides of aluminum, lanthanum, bismuth, yttrium and/or rare earths are preferred.

In this case, rare earths designate the chemical elements of the third subgroup of the periodic table (with the exception of actinium) and the lanthanides.

According to at least one embodiment, the proportion of $R^2_2O_3$ is at least 1.2 mol. %, 1.4 mol. %, 1.5 mol. % or 1.75 mol. % and/or at the most 1.9 mol. %, 2 mol. %, 2.4 mol. % or 2.6 mol. %, for example, 1.7 mol. %. In particular, the proportion of $R^2_2O_3$ should not be greater than 3 mol. % in the glass composition since this has a disadvantageous effect on the properties of the glass composition. A proportion of $R^2_2O_3$ of greater than 3 mol. % can increase the transition, sintering and/or softening temperatures.

The components for the glass composition can be selected from the oxides of trivalent metals but also from hydroxides, carbonates, nitrates etc, in so far as they exist, of trivalent metals. However, non-coloring compounds or compounds which color in a controlled manner ("filters") such as aluminum oxide, lanthanum oxide, bismuth oxide, yttrium oxide and/or oxides of rare earth metals are preferably selected.

The presence of $R^2_2O_3$ in the glass composition influences the crystallization tendency to an unexpectedly high degree. Thus, by the addition of $R^2_2O_3$ the crystallization of the glass composition during use, for example, during joining or in devices, can be prevented. Therefore, a glass composition can be provided which includes no light scattering in a broad spectral range of 380 nm to 800 nm.

Alternatively or additionally, the glass composition can comprise at least titanium dioxide, zirconium dioxide, hafnium dioxide or combinations of these oxides as $M^2O_2$. In particular, the proportion of $M^2O_2$ is between 1 and 1.5 mol. %, for example, 1.3 mol. %.

Alternatively or additionally, the glass composition can comprise niobium oxide and/or tantalum oxide ($R^3{}_2O_5$). Niobium oxide can be used in the form of niobium(II)-oxide (NbO), niobium(IV)-oxide ($NbO_2$) and/or niobium(V)-oxide ($Nb_2O_5$). Tantalum oxide can be used in the form of tantalum(II)-oxide (TaO), tantalum(IV)-oxide ($TaO_2$) and/or tantalum(V)-oxide ($Ta_2O_5$). Niobium oxide or tantalum oxide can increase the chemical stability of the glass composition but also, to a slight extent, the viscosity.

According to at least one embodiment, the proportion of niobium oxide and/or tantalum oxide is at least 1 mol. %, 2 mol. % or 3 mol. % and/or at the most 4 mol. % or 5 mol. %.

According to at least one embodiment, the glass composition consists of tellurium oxide, $M^1{}_2O$, $R^1O$ and $R^2{}_2O_3$, wherein $R^2{}_2O_3$ comprises a proportion between 1.5 mol. % and 2 mol. %.

The inventors have recognized that the components of the glass composition lower the crystallization tendency without at the same time substantially raising the glass transition temperature and softening temperature. In particular, aluminum oxide, lanthanum oxide, bismuth oxide, yttrium oxide and/or rare earths are responsible for lowering the crystallization tendency.

Glass transition temperature ($T_g$) is the temperature at which a glass or the glass composition is converted from the brittle-elastic range into the viscoelastic range. The measurement of the glass transition temperature can take place, inter alia, with the aid of a dilatometer (TMA=thermomechanical analysis) or dynamic difference calorimetry (DSC) or difference-thermoanalysis (DTA).

The softening temperature ($T_e$) is the temperature at which the glass or the glass composition begins to deform noticeably and thereby deforms under the influence of the intrinsic weight. The softening temperature is an essential parameter during joining. In these processes, the glass must be heated to a temperature which is higher than the softening temperature and must flow to a significant extent in order to create a firm bond between the materials to be joined. If these materials are temperature-sensitive, a durable joint will require the lowest possible softening temperature in order also to keep the joining temperature as low as possible. The softening temperature can be determined using dynamic difference calorimetry (DSC) or dilatometry (TMA) or a viscosity measurement.

The crystallization of the glass composition or a lack of crystallization of the glass composition can be determined by X-ray diffraction (XRD).

According to at least one embodiment, the glass composition is free of boron trioxide, germanium oxide, phosphates, halides, $P_2O_5$, silicates and/or $SiO_2$. "Free of" means here and hereinafter that the glass composition contains no proportions or only very slight proportions in the ppm range, for example, a proportion of at the most $10^{-4}$ ppm, of said compounds in the glass composition.

The disadvantage with boron trioxide and, for example, phosphorous pentoxide is that they comprise only a low level of chemical stability. Therefore, they are unsuitable for many applications owing to the lack of corrosion stability.

Furthermore, for example, low-softening phosphate glasses and borate glasses generally contain considerable concentrations of $B_2O_3$ or $P_2O_5$ and alkali oxides and have only a low level of chemical stability. Therefore, they are unsuitable for many applications owing to the lack of corrosion stability. Furthermore, the demixing behavior of tellurite glasses changes suddenly where the combination of $TeO_2$ with $B_2O_3$ and $GeO_2$ are concerned (see W. Vogel: Glaschemie. $3^{rd}$ edition, Werner Vogel, Springer-Verlag 1992). This is imposed by the considerably denser 3-D structural elements of borate phases and germate phases compared with tellurite glass chain units. Demixing processes can on the one hand accelerate crystallization but on the other hand also themselves act in a scattering way or have a negative influence on the corrosion properties. A further aspect is that borate, phosphate and silicate systems are not highly refractive and thus lower the refraction index depending on the proportion.

Therefore, a glass composition containing boron trioxide and/or germanium oxide tends towards crystallization in a disadvantageous manner by reason of demixing behavior whereby the transmission of the glass composition can be reduced owing to scattering.

According to at least one embodiment, the glass composition conforms to the RoHS (Restriction of certain Hazardous Substances) and is free of lead, arsenic, cadmium, uranium and Th.

According to at least one embodiment, the glass transition temperature has a value of less than 320° C., in particular less than or equal to 295° C.

According to at least one embodiment, the dilatometric softening temperature has a value of less than 400° C., in particular less than 350° C. or less than 325° C.

According to at least one embodiment, the glass composition is radiation-permeable and/or free of scattering. This means in particular that 90%, less the Fesnel losses >95%, ideally >99%, of the incident electromagnetic radiation is transmitted from a wavelength range of 380 nm to 800 nm. The glass composition comprises in particular the property of having a high level of transmission and low absorption. In particular, the glass composition absorbs <10%, preferably <5%, particularly preferably <1% of the incident electromagnetic radiation from a wavelength range of 380 nm to 800 nm. The Fresnel losses can be 8-11% per boundary surface depending on the refraction index.

According to at least one embodiment, the glass composition is colorless. Here and hereinafter, colorless means that the glass composition absorbs no electromagnetic radiation, i.e. at the most 5% of the incident electromagnetic radiation from a wavelength range of 380 nm to 800 nm. An exception in this case is a component in the glass composition which carries out a filtering effect or whereby, after excitation with primary radiation, secondary radiation is emitted. The latter applies, in particular for rare earths which lead to fluorescent glasses. In addition, the glass composition advantageously has a highly refractive property. For example, the refraction index is dependent on the content of tellurium oxide in the glass composition or in the glass. In particular, the glass composition has a refraction index $n \geq 1.8$, in particular $n \geq 2$.

According to at least one embodiment, the glass composition includes a further component which increases the refraction index of the glass composition. Compounds which increase the refraction index and are, for example, known to the person skilled in the art, for example, $La_2O_3$, can be added to the glass composition.

According to at least one embodiment, the glass composition includes a further additional component which has radiation-absorbing properties. The further additional component preferably absorbs radiation in the wavelength range of ≤380 nm, preferably in a wavelength range of ≤400 nm. In particular, the further additional component absorbs >20%, preferably >40%, particularly preferably >60% of the radiation in said wavelength range. Therefore, the glass composition or the glass can additionally serve as a UV filter.

Furthermore, a method for producing a device and a device are also provided. The device includes the glass composition or the glass with the described glass composition. The same definitions and embodiments apply for the method or for the device as given above for the glass composition, and vice versa.

According to at least one embodiment, the device comprises a first mounting element with a mounting surface, a glass composition as described above and a second mounting element. The glass composition is arranged between the mounting surface of the first mounting element and the second mounting element, wherein the glass composition is formed as an adhesive layer, and wherein the glass composition connects the mounting surface of the first mounting element and the second mounting element to one another.

In particular, the device is a light-emitting diode, a high-power LED and/or is suitable for laser applications.

According to at least one embodiment, the first mounting element and/or the second mounting element are each selected from a group which includes a semiconductor chip, a ceramic, a silicate glass, a metal, a conversion ceramic, a lens, a functional oxide coating or combinations thereof. The device can, in particular in the form of the first mounting element and/or of the second mounting element, also comprise one or a plurality of functional oxidic coatings which act, for example, as passivation, as a protective layer and/or as an optical element. This at least one coating can be formed as a single layer or even as a layer stack and can be amorphous, crystalline or partially crystalline and alternatively or additionally can be connected to the glass of the glass composition.

According to at least one embodiment, between the first mounting element and/or the second mounting element on the one hand and the glass composition on the other hand such a functional oxidic coating is provided. In this case, the functional oxidic coating is preferably in direct contact with the first mounting element and/or the second mounting element and with the glass composition.

In a particularly preferred manner, the first mounting element and/or the second mounting element has the functional oxidic coating as a mounting surface. The oxidic coating is, for example, a dichroic mirror or layer stack, for example, on sapphire, a protective layer on a metal such as alanod, or passivation on a semiconductor chip. In particular, the functional oxidic coating includes or consists of one or a plurality of the following materials: aluminum oxide, zirconium oxide, zinc oxide, tin oxide, copper oxide, but preferably $SiO_2$ and/or $TiO_2$. In particular, the functional oxidic coating is applied to a metal such as aluminum or molybdenum or to an insulator such as sapphire or to a semiconductor such as Si or Ge.

In particular, a lens or a ceramic can be mounted on a semiconductor chip by means of the glass composition. Therefore, lenses or ceramic and a semiconductor chip can be fixedly connected to one another.

According to at least one embodiment, the first mounting element is a ceramic or a metal and the second mounting element is a ceramic. In particular, the device is arranged in the beam path of a laser or semiconductor chip and spaced apart therefrom.

According to at least one embodiment, the glass composition can connect a conversion element, which is arranged for conversion of primary radiation into secondary radiation, to a semiconductor chip. In this case, the glass composition functions as an adhesive layer.

According to at least one embodiment, the glass composition is formed exclusively as a connecting layer or adhesive layer. This means in particular that the glass composition is free of particles or powder particles, for example, scatter particles and/or luminescent material and/or luminescent particles. Backscattering of electromagnetic primary radiation and/or secondary radiation, i.e. backscattering caused by scatter particles and/or luminescent particles, in the direction of the semiconductor chip can thus be avoided and the outcoupling of light of the device can be increased. In particular, the chromaticity coordinate and/or the luminous color are thereby unchanged.

According to at least one embodiment, semiconductor chips include a semiconductor layer sequence. The semiconductor layer sequence of the semiconductor chip is preferably based on a V-IV compound semiconductor material. The semiconductor material is preferably a nitride compound semiconductor material such as $Al_n In_{1-n-m} Ga_m N$ or even a phosphide compound semiconductor material such as $Al_n In_{1-n-m} Ga_m P$, wherein in each case 0≤n≤1, 0≤m≤1 and n+m≤1. The semiconductor material can likewise be $Al_x Ga_{1-x} As$ with 0≤x≤1. Thus, the semiconductor layer sequence can comprise dopants and additional constituents. For the sake of simplicity, however, only the essential constituents of the crystal lattice of the semiconductor layer sequence, i.e Al, As, Ga, In, N or P are given, even if these may in part be replaced and/or supplemented by small quantities of further substances.

The semiconductor element can contain an active layer with at least one pn junction and/or with one or a plurality of quantum well structures. In operation of the semiconductor element, electromagnetic primary radiation is generated in the active layer. A wavelength of the electromagnetic primary radiation is preferably in the ultraviolet and/or visible spectral range, in particular at wavelengths between 420 nm and 680 nm inclusive, for example, between 440 nm and 480 nm inclusive.

According to at least one embodiment, the first mounting element is a semiconductor chip and the second mounting element is a transparent silicate glass, a converting ceramic or a transmitting ceramic.

Here and hereinafter, silicate glass designates a glass which comprises silicon dioxide as a main constituent.

According to at least one embodiment, the glass composition is an ultra-low melting material. A material which softens at a temperature of at the most 350° C. is considered within the present application to be an ultra-low melting material. This leads to the advantage that the glass composition can be connected directly to the semiconductor chip at low temperatures of at the most 350° C., wherein at such temperatures the semiconductor chip is not damaged.

According to at least one embodiment, the glass composition is formed as an adhesion-promoting layer or adhesive layer. In particular, the glass composition or the glass with the described glass composition connects a semiconductor chip or a ceramic, glass or metal substrate (for example, sapphire, aluminum or other reflectors), for example, for laser applications (in transmission or reflection), such as LARP, to a second mounting element. This second mounting element can be glass or ceramic. In particular, the second mounting element can be a conversion element. Additionally or alternatively, the glass composition can also be used for connecting further elements, for example, a lens or a cover or a substrate. The device can, as also in all other embodiments, comprise one or a plurality of functional oxidic coatings which act, for example, as passivation, as a protective layer and/or as an optical element. This at least one coating can be formed as a single layer or even as a layer stack and can be amorphous, crystalline or partially crystalline and alternatively or additionally can be connected to the glass of the glass composition.

The method for producing a device comprises the method steps of:

a) providing a first mounting element which comprises a mounting surface, b) applying a glass composition as described above or a glass with the described glass composition directly to the mounting surface, wherein the glass composition can also be a functional oxidic coating of the device, or additionally or alternatively to the glass composition, such a functional oxidic coating can be provided.

b1) applying a second mounting element to the glass composition, c) heating the device to at the most 400° C. so that a bond is produced between the mounting surface of the first mounting element and the glass composition, or the glass with the described glass composition and the second mounting element.

The inventors have recognized that the glass composition described herein or the glass with the glass composition described herein has a low crystallization tendency, is extremely low-sintering and thus is suitable for joining applications, i.e. the connection of at least two mounting elements. Furthermore, the glass composition has a low softening temperature. The glass composition is transparent and/or highly refractive. Thus the glass composition is suitable in particular for joining mounting elements for optical applications. In this case, preferably transparent optical mounting elements are fixedly and durably connected to one another. The bond of the mounting element with the glass composition is produced at temperatures below 400° C. By reason of these low joining temperatures, mounting elements which cannot withstand high temperatures can thus also be joined to one another. For the sake of completeness, it is stated that during the joining of temperature-stable devices, higher joining temperatures can also be used, whereby extremely thin adhesive layers can be produced. The joining temperature is then preferably at least 400° C. and alternatively or additionally at the most 600° C. or 550° C.

The glass composition in accordance with the invention can also be ground after melting and screen to a specific particle size fraction. It can then be introduced between the materials or mounting elements to be joined, possibly with the aid of suitable auxiliary agents such as oils or polymer solutions. In a further method step, the glass composition or the glass and the materials to be joined can be heated, possibly under vacuum, to at the most 400° C. This leads to sintering of the glass composition or glass powder particles and to a bond between the glass composition or the glass and the materials to be joined and therefore to a strong attachment of the glass composition or of the joining glass to the materials to be joined. In particular, the oxides of the $R^2{}_2O_3$, such as, for example, aluminum, positively influence the crystallization of the glass composition during production and so the glass composition or the glass does not crystallize during joining.

For many applications it is disadvantageous, in particular in optical technology, if crystallization occurs during compaction of the glass powder layer (also called vitrifying), since light scattering on the crystals can then be observed or take place. According to one embodiment, the glass composition includes no crystallization after compaction. In particular, the glass composition is suitable for joining semiconductors and ceramics as well as silicate glasses.

In particular, the glass composition is suitable for joining semiconductors to transparent silicate glasses and also metals.

In particular, the glass composition is suitable for joining ceramic elements to semiconductors or to reflective and transmissive substrates.

In particular, the glass composition is suitable for joining two ceramic elements. These can be reflective and/or transmissive and/or radiation-converting. For example, the glass composition can be used to connect two conversion ceramics of the same or different color.

Details of color in relation to conversion ceramics here and hereinafter designate the respective spectral range of the electromagnetic radiation, for example, of the electromagnetic secondary radiation.

In particular, the glass composition is suitable for joining ceramic elements to reflective metal substrates. For example, for laser application a conversion ceramic can be joined to a reflective metal substrate, or a transmissive or reflective ceramic substrate. In this case, the substrate can also comprise a functional oxidic coating, as explained in conjunction with the device, and can be connected to the conversion ceramic via the glass of the glass composition.

According to at least one embodiment, method step c) takes place under weighting.

According to at least one embodiment, the first mounting element is a semiconductor chip which is arranged to generate electromagnetic primary radiation at least from the blue spectral range, and the mounting surface is a radiation exit surface. This also contains high-power chips and laser applications. In the case of laser applications, it can be the surface of a transmissive or reflective substrate. Owing to the temperature sensitivity of semiconductor chips, an organic material, usually silicone, is generally used as the bonding material. This has a low level of heat conduction (0.1 W/mK) and a low refraction index (ca. 1.4) whereby the efficiency of the device is reduced since heat is poorly dissipated and light is not coupled-out as efficiently. The latter point is caused by the fact that the semiconductor surfaces are typically highly refractive. The refraction index of, for example, GaN is 2.5. If the bond is produced by the glass with the described glass composition, the high refraction index causes the outcoupling of light to be improved and the improved heat conduction causes heat dissipation to increase many times over. The heat conduction of the glass composition in pure glass is ca. 0.7 W/mK, whereby the heat dissipation is ca. 7 times as high as with silicone.

According to at least one embodiment, in method step b) the glass composition is applied to the surface of the first mounting element as a powder or as a preformed body or as droplets from the melt. Preproduced bodies means in this connection that the glass composition or the glass can be mounted onto the surface of the first mounting element, for example, onto the surface or radiation exit surface of the semiconductor chip in a pick-and-place process. The preproduced body can be manufactured by first melting the glass from the mix. The glass melt is cast or molded and then cooled and so a solid body is produced, wherein the preproduced body is obtained.

According to at least one embodiment, the preproduced body is a separate platelet. The platelet is applied to the radiation exit surface of the semiconductor chip. In particular, the glass composition is produced as a thin layer directly on the semiconductor chip or as a separate platelet at higher temperatures of over 350° C. Alternatively or additionally, the glass composition can be applied as a thin layer or as droplets from the melt directly to a substrate or a lens. At this temperature the glass preferably has a viscosity $\eta$ n of $10^{7.6}$ dPas*s≥$\eta$≥$10^{-2}$ dPas*s, in particular of $10^4$ dPas*s≥$\eta$≥$10^{-2}$ dPas*s, ideally of $10^2$ dPas*s≥$\eta$≥$10^{-2}$ dPas*s. Alternatively, this layer can also be produced in negative pressure and/or by weighting at lower temperatures, i.e. at higher viscosities. In particular, the glass preferably has a viscosity $\eta$ of $10^{7.6}$ dPas*s at its softening temperature and/or $10^4$ dPas*s at its processing temperature. An extremely compact glass layer with few bubbles is thereby produced.

According to at least one embodiment, the adhesion and therefore the grip of the glass composition or of the glass to the mounting elements to be joined is high in comparison to other conventional glass compositions. The glass composition according to the invention has the advantage that it comprises good wetting on the mounting elements and thus a strong bond is produced between the first mounting element, the glass composition and the second mounting element.

According to at least one embodiment, the layer thickness of the glass composition can, for adhesion, be between 0-30 μm, in particular between 5-20 μm, particularly preferably between 8-15 μm. In a preferred embodiment, the layer thickness of the glass composition is at least 0 or at least 10 nm or at least 100 nm and/or at the most 10 μm or 5 μm or 3 μm, in particular between 100 nm and 3 μm inclusive. This can be dependent in particular on the evenness of the surfaces to be connected and/or on the geometry, and/or can be limited by the differences in expansion between the three materials. Furthermore, the layer thickness of the glass composition can be influenced, for example, by the joining temperature and therefore by the viscosity of the joining glass and the pressure applied.

According to at least one embodiment, the glass composition is fluorescent and/or converts at least part of the primary radiation. However, this means that the glass composition is innately fluorescent and/or converting and is therefore free of particles, for example, scatter particles or luminescent particles, which cause fluorescence or conversion of primary radiation.

BRIEF DESCRIPTION OF THE DRAWINGS

A glass composition described herein, a device and a method for producing a device are explained in more detail hereinunder with reference to the drawing and with the aid of exemplified embodiments. Like reference numerals designate like elements in the individual figures. However, no references to scale are shown. Rather, individual elements can be illustrated in greatly exaggerated fashion for improved understanding.

In the drawing:

FIG. 1 shows exemplified embodiments A1 to A7 of a glass composition and comparative examples V1 to V4, FIG. 5 shows a transmission spectrum of an exemplified embodiment.

DETAILED DESCRIPTION OF ILLUSRTRATIVE EMBODIMENTS

FIG. 1 shows embodiments A1 to A7 of a glass composition, in table form. Furthermore, the table shows comparative examples V1 to V4 of conventional glass compositions. The values given in the table include a maximum error of 5%. The glass compositions of exemplified embodiments A1 to A7 comprise tellurium oxide. In particular, tellurium oxide is $TeO_2$. The proportion of tellurium oxide in A1 to A7 is between 67 mol. % and 69 mol. %. In particular, the proportion of tellurium oxide is between 67.5 mol. % and 68.5 mol. %.

The glass composition further comprises $R^1O$ as a zinc oxide. The proportion of zinc oxide is between 18 mol. % and 20 mol. % inclusive.

The glass composition further comprises $M^1_2O$ in the form of disodium oxide. The proportion of disodium oxide in the glass composition is between 10 mol. % and 12 mol. % inclusive.

Furthermore, the glass composition comprises an oxide of a trivalent metal, such as, for example, aluminum trioxide, lanthanum trioxide, bismuth trioxide and/or yttrium trioxide. The proportion of the oxide of a trivalent metal is between 1.5 mol. % and 2.5 mol. %.

Furthermore, FIG. 1 shows the glass transition temperatures $T_g$ in ° C. for exemplified embodiments A1 to A7 determined by dilatometry. The glass transition temperatures are between 283° C. and 294° C. In particular, the glass transition temperatures of the glass compositions are <295° C.

Furthermore, FIG. 1 shows the associated coefficients of thermal expansion $\alpha$ and the softening temperatures $T_e$ in ° C. of exemplified embodiments A1 to A7. $T_e$ is between 308° C. and 323° C. and was determined by dilatometry.

Furthermore, FIG. 1 shows a refraction index n for exemplified embodiments A2, A5 and A6 of ca. 2, which was determined at a wavelength of 546.06 nm.

Comparative examples V1 to V4 are shown as a comparison to this. Comparative examples V1 to V4 differ from exemplified embodiments A1 to A7 in particular in that the glass composition of V1 to V4 comprises no oxides of trivalent metals. In a corresponding manner, the comparative examples show higher softening temperatures Te of ≥329° C. (V2, V4) and/or a strong crystallization tendency (V1, V3), in particular during production.

Figure 2:
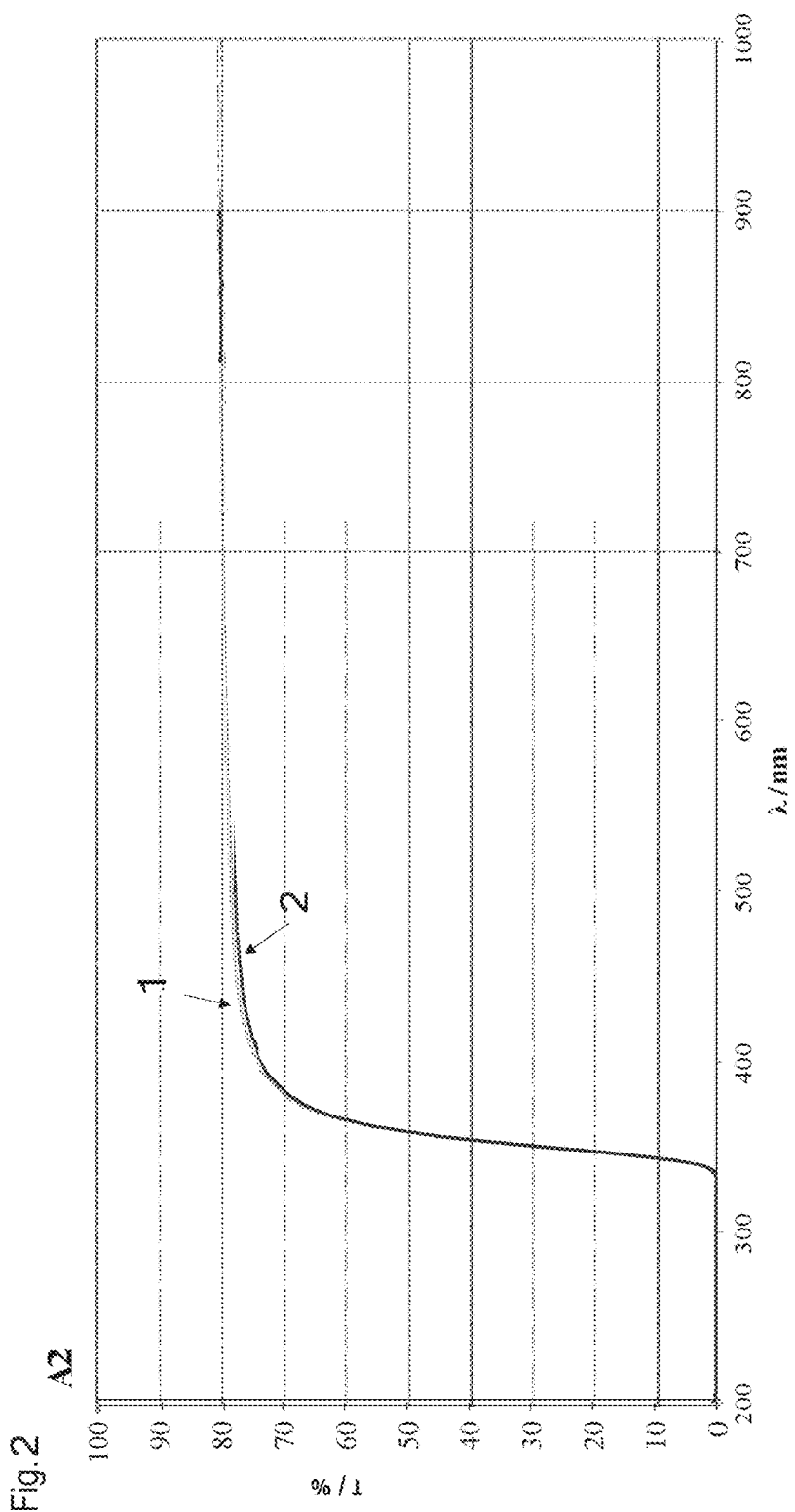
FIG. 2 shows a transmission spectrum of an exemplified embodiment.

FIG. 2 shows a transmission spectrum for exemplified embodiment A2, which is shown in the table of FIG. 1. The transmission T in % is shown in dependence upon the wavelength λ in nm. Curve 1 shows the glass composition prior to a weathering test, wherein the wall thickness WD of the sample WD=0.89 mm. Curve 2 shows the transmission curve of the glass composition of A2 after the weathering test was carried out. The weathering test took place in such a way that the glass composition was subjected to a temperature of 85° C. at a relative humidity of 85% and over 1000 hours. A comparison of the glass composition before (curve 1) and after (curve 2) the weathering test shows essentially no difference in transmission. It can be concluded from this that the glass composition or the glass did not change during the test. Thus, the glass composition of exemplified embodiment A2 is particularly weather-resistant and corrosion-resistant.

Figure 3:
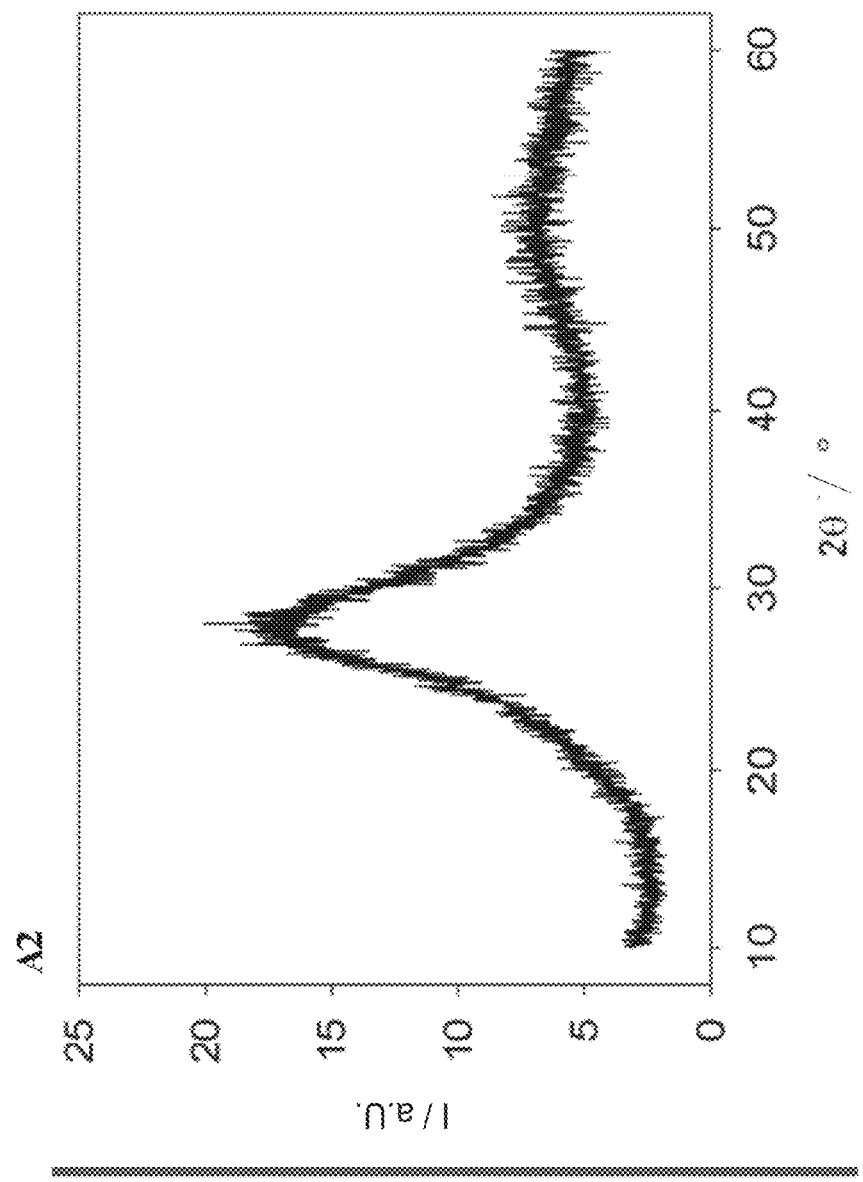
FIG. 3 shows an X-ray diffraction diagram of an exemplified embodiment.

FIG. 3 shows an X-ray diffraction diagram of exemplified embodiment A2 according to the table in FIG. 1. The intensity I in a.u. (arbitrary units) is shown in dependence upon 2θ in °. From the graph it is possible to see that the glass composition is purely amorphous and not present in crystallized form. This is advantageous since, as a result, the glass composition in particular scatters no electromagnetic radiation from the visible range.

Figure 4:
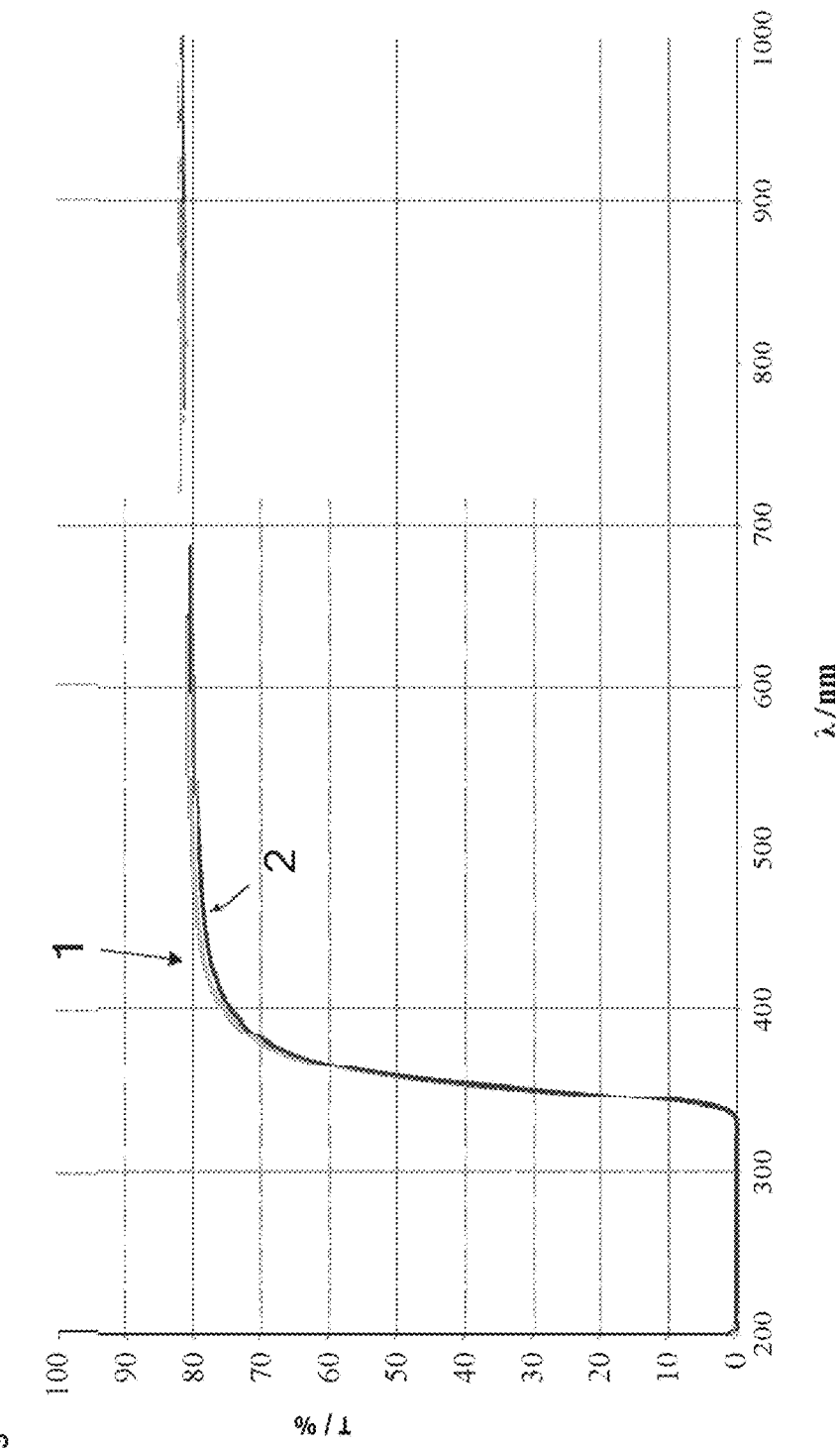
FIG. 4 shows a transmission spectrum of an exemplified embodiment.

FIG. 4 shows a transmission spectrum of exemplified embodiment A6 of the table in FIG. 1. The transmission T in % is shown in dependence upon the wavelength λ in nm. Curve 1 shows the glass composition with a wall thickness of 0.98 mm prior to the weathering test, curve 2 shows the glass composition after the weathering test. The transmission does not substantially change owing to the influence of temperature, relative humidity and over time (1000 hours) in the entire wavelength range from 200 nm to 1000 nm.

FIG. 5 shows a transmission spectrum with T in % in dependence on the wavelength λ in nm of exemplified embodiment A7 with a wall thickness of 0.96 mm from the table in FIG. 1. The transmission curves before (curve 1) and after (curve 2) the weathering test are shown. Exemplified embodiment A7 is also weather-resistant.

Figure 5A:
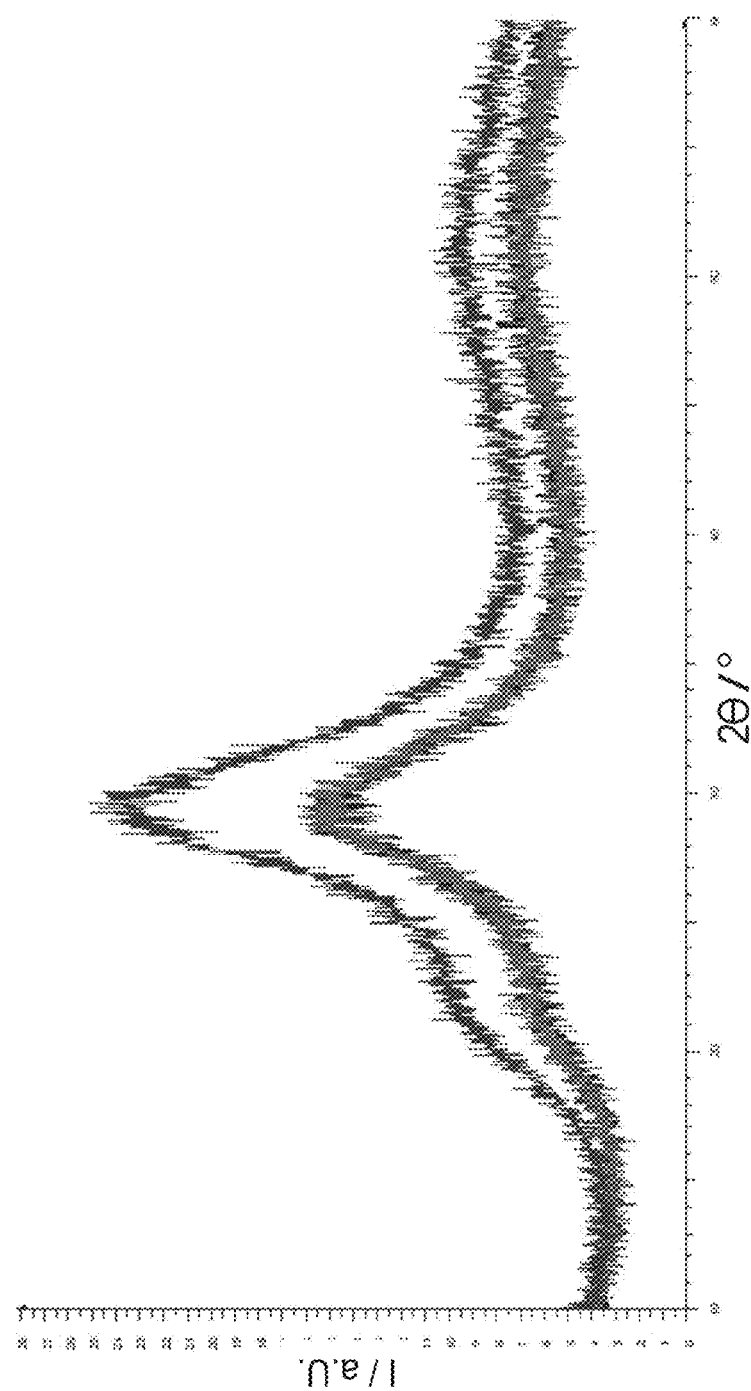
FIG. 5a shows a comparison of X-ray diffraction diagrams of three exemplified embodiments, and FIGS. 6 and 7 each show a device according to one embodiment.

FIG. 5a shows an X-ray diffraction diagram of each exemplified embodiment A2, A5 and A6 according to the table in FIG. 1. The intensity I in a.u. (arbitrary units) is shown in dependence upon 2θ in °. From the graph it is possible to see that the glass compositions A2, A5 and A6 are purely amorphous and no crystals are present. This is advantageous since, as a result, the glass composition in particular scatters no electromagnetic radiation from the visible range.

Figure 6:
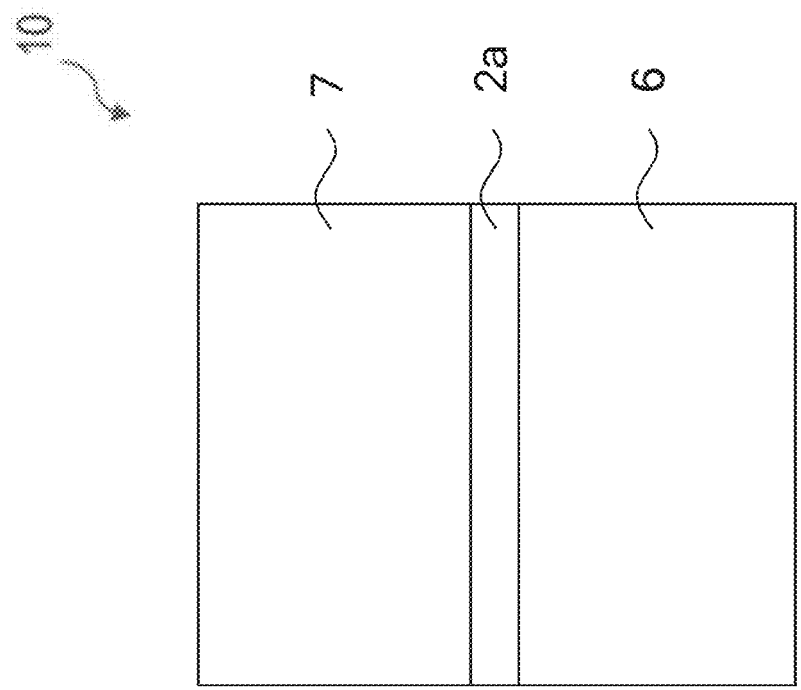

FIG. 6 shows a schematic side view of a device 10 according to one embodiment. A glass composition is applied to a first mounting element 6. The glass composition 2a is formed as a glass layer. The glass composition or glass layer 2a can be applied in the form of a powder. Alternatively, the glass composition or the glass layer 2a can be applied to the mounting surface of the first mounting element 6 in the form of a preproduced body, for example, a platelet or a fiber portion or a sphere or hemisphere. Furthermore, a second mounting element 7 is applied to the glass composition or the glass layer 2a. This can also take place under weighting. By sintering at least the glass composition or the glass layer 2a, i.e. by raising the temperature to at the most 400° C., a bond can be produced between the first mounting element 6, the glass composition or the glass layer 2a and the second mounting element 7. Therefore, the glass composition or the glass layer 2a acts as an adhesion-promoting layer between the two mounting elements. In particular, the glass composition according to the invention is suitable for joining temperature-sensitive mounting elements since it has a softening temperature of below 400° C. and at the same time is corrosion-stable and crystallization-stable.

Alternatively, the adhesion can also take place under negative pressure and/or with weighting at the same or a lower temperature.

In particular, the adhesion depicted in FIG. 6 can also occur multiple times in a device. This would be, for example, adhesion of a semiconductor chip to a conversion ceramic to which a lens is adhered.

FIG. 7 shows a schematic side view of a device 10, for example, an optoelectronic device, according to one embodiment. The semiconductor chip 1 is arranged on a carrier 5. A glass composition 2a and a conversion layer 2 are then arranged. The conversion layer 2 is in particular ceramic. The device 10 can be produced by the provision of a carrier 5 and application of a semiconductor chip 1. The glass composition can then be applied to the radiation exit surface ii of the semiconductor chip 1. The glass composition 2a can thus be applied as a preproduced body, for example, as a platelet, or applied as powder or as glass spheres. The application in the form of a platelet to the radiation exit surface 11 of the semiconductor layer sequence 1 can be carried out in a so-called pick-and-place process. The conversion element 2 can then be applied to the glass composition 2a, wherein the temperature is raised to at the most 350° C. and therefore the semiconductor chip 1 and the conversion element 2 are connected to one another. This is preferably carried out under weight. During application of the conversion element 2 to the glass composition 2a, this composition can protrude or spill over the side surfaces of the semiconductor chip 1 and/or over the flanks of the conversion element 2. This can happen, for example, owing to the use of larger quantities of liquid or pasty glass composition 2a. Thus the glass composition 2a forms a completely homogeneous layer on the radiation exit surface 11 of the semiconductor chip 1 and a type of bead over the radiation exit surface 11. In particular, the glass composition 2a pressed out in the form of a bead is colorless, which shows that the glass composition 2a was not discolored and was of low viscosity.

The description using the exemplified embodiments does not limit the invention thereto; rather, the invention includes any feature and any combination of features, including in particular any combination of features in the claims, even if this feature or this combination is not itself explicitly indicated in the claims or exemplified embodiments.

The invention claimed is:
1. A glass composition comprising:
   at least one tellurium oxide in a proportion of at least 65 mol. % and at most 90 mol. %;
   $R^1O$ in a proportion between 10 mol. % and 20 mol. %, wherein $R^1$ is selected from the group consisting of Mg, Ca, Sr, Ba, Zn, Mn and combinations thereof;
   at least one $M^1_2O$ in a proportion between 5 mol. % and 25 mol. %, wherein $M^1$ is selected from the group consisting of Li, Na, K and combinations thereof;
   at least one $R^2_2O_3$ in a proportion between 1 mol. % and 3 mol. %, wherein $R^2$ is selected from the group consisting of Al, Ga, In, Bi, Sc, Y, La, rare earths and combinations thereof;
   $M^2O_2$ in a proportion between 0 mol. % and 2 mol. %, wherein $M^2$ is selected from the group consisting of Ti, Zr, Hf and combinations thereof; and
   $R^3_2O_5$ in a proportion between 0 mol. % and 6 .%, wherein $R^3$ is selected from Nb and/or Ta,
   wherein a sum of all proportions of tellurium oxide, $M^1_2O$, $R^2_2O_3$, $M^2O_2$, $R^3_2O_5$ and $R^1O$ in the glass composition is 100 mol. %, and
   wherein the glass composition is free of boron trioxide, germanium oxide, phosphates, halides, $P_2O_5$, silicon dioxide and silicates.
2. The glass composition according to claim 1, wherein the glass composition consists essentially of tellurium oxide, $M^1_2O$, $R^1O$ and $R^2_2O_3$, wherein tellurium oxide is in a proportion of at least 65 mol. % and at most 90 mol. % present, wherein $R^1O$ is in a proportion between 0 mol. % and 20 mol. % present, wherein $R^1$ is selected from the group consisting of Mg, Ca, Sr, Ba, Zn, Mn and combinations thereof, wherein $M^1_2O$ is in a proportion between 10 mol. % and 12 mol. % present, wherein $M^1$ is selected from the group consisting of Li, Na, K and combinations thereof, wherein $R^2_2O_3$ is in a proportion between 1.5 mol. % and 2 mol. % present, wherein $R^2$ is selected from the group consisting of Al, Ga, In, Bi, Sc, Y, La, rare earths and combinations thereof.

3. The glass composition according to claim 1, wherein the tellurium oxide is $TeO_2$ and comprises a proportion of at least 67 mol. % and at most 69 mol. %.

4. The glass composition according to claim 1, wherein $R^1O$ has a proportion of between 14 mol. % and 18 mol. %.

5. The Glass composition according to claim 1, wherein $M^1_2O$ has a proportion of between 8 mol. % and 14 mol. %.

6. The glass composition according to claim 1, wherein $R^2$ is selected from the group consisting of Al, La, Y and Bi, and wherein $R^2_2O_3$ comprises a proportion between 1.5 mol. % and 2.5 mol. %.

7. The glass composition according to claim 1, wherein the glass composition consists essentially of tellurium oxide, $M^1_2O$, $R^2_2O_3$, and wherein $R^2_2O_3$ comprises a proportion between 1.5 mol. % and 2 mol. %.

8. The glass composition according to claim 1, wherein the glass composition has a glass transition temperature of less than 320° C. and has a dilatometric softening temperature of less than 400° C.

9. The glass composition according to claim 1, wherein the glass composition is radiation-permeable so that at least 90% of an incident electromagnetic radiation from a wavelength range of 380 nm to 800 nm is transmitted.

10. A device comprising:
a first mounting element with a mounting surface;
the glass composition according to claim 1; and
a second mounting element,
wherein the glass composition is arranged between the mounting surface of the first mounting element and the second mounting element,
wherein the glass composition is formed as an adhesive layer, and
wherein the glass composition connects the mounting surface of the first mounting element and the second mounting element to one another.

11. The device according to claim 10, wherein each of the first mounting element and the second mounting element is selected from a semiconductor chip, a ceramic, a silicate glass, a metal, a conversion ceramic, a lens or combinations thereof, and wherein the first mounting element and/or the second mounting element include a functional oxidic coating.

12. The device according to claim 10, wherein the first mounting element is a semiconductor chip and the second mounting element is a transparent silicate glass, a converting ceramic or a transmitting ceramic.

13. The device according to claim 10, wherein the first mounting element is a ceramic or a metal and the second mounting element is a ceramic.

14. A method for producing a device according to claim 10, the method comprising:
providing the first mounting element comprising a mounting surface;
applying the glass composition directly to the mounting surface;
applying the second mounting element to the glass composition; and
heating the device to at most 400° C. so that a bond is produced between the mounting surface of the first mounting element and the glass composition and the second mounting element.

15. The method according to claim 14, wherein applying the glass composition to the mounting surface of the first mounting element comprises applying the glass composition as a powder or preproduced body.

16. A glass consisting essentially of tellurium oxide, $M^1_2O$, $R^1O$ and $R^2_2O_3$, wherein tellurium oxide is in a proportion of at least 65 mol. % and at most 90 mol. % present, wherein $R^1O$ is in a proportion between 10 mol. % and 20 mol. % present, wherein $R^1$ is selected from the group consisting of Mg, Ca, Sr, Ba, Zn, Mn and combinations thereof, wherein $M^1_2O$ is in a proportion between 10 mol. % and 12 mol. % present, wherein $M^1$ is selected from the group consisting of Li, Na, K and combinations thereof, wherein $R^2_2O_3$ is in a proportion between 1.5 mol. % and 2 mol. % present, wherein $R^2$ is selected from the group consisting of Al, Ga, In, Bi, Sc, Y, La, rare earths and combinations thereof.

* * * * *

UNITED STATES PATENT AND TRADEMARK OFFICE
CERTIFICATE OF CORRECTION

PATENT NO. : 10,233,114 B2
APPLICATION NO. : 15/102988
DATED : March 19, 2019
INVENTOR(S) : Angela Eberhardt et al.

It is certified that error appears in the above-identified patent and that said Letters Patent is hereby corrected as shown below:

In the Claims

In Column 14, Line 57, Claim 1, delete "6 .%," and insert --6 mol.%,--.

Signed and Sealed this
Fourteenth Day of May, 2019

Andrei Iancu
*Director of the United States Patent and Trademark Office*